United States Patent [19]

Hasegawa et al.

[11] Patent Number: 4,558,921
[45] Date of Patent: Dec. 17, 1985

[54] SOLITON FIBER TELECOMMUNICATION SYSTEMS

[75] Inventors: Akira Hasegawa, New Providence; Yuji Kodama, Plainfield, both of N.J.

[73] Assignee: AT&T Bell Laboratories, Murray Hill, N.J.

[21] Appl. No.: 701,654

[22] Filed: Feb. 14, 1985

Related U.S. Application Data

[63] Continuation of Ser. No. 352,330, Feb. 25, 1982.

[51] Int. Cl.$^4$ ................................................. G02B 5/14
[52] U.S. Cl. ................................................. 350/96.29
[58] Field of Search ................. 350/96.31, 96.11, 96.29

[56] References Cited

U.S. PATENT DOCUMENTS 3,943,358  3/1976  Reymond et al. ............... 350/96.29

FOREIGN PATENT DOCUMENTS 2248371  4/1974  Fed. Rep. of Germany ... 350/96.29

OTHER PUBLICATIONS

"Signal Transmission by Optical Solitions in Monomode Fiber"; by Hasegawa et al.; *Proc. of the IEEE;* vol. 69, No. 9; Sep. 1981; pp. 1145–1150.

Periasamy et al.; "Laser Amplification in an Optical Fiber by Evanescent Field Coupling"; Applied Physics; vol. 24, No. 3, (Mar.) 1981; pp. 201–203.

*Primary Examiner*—William L. Sikes
*Assistant Examiner*—Robert E. Wise
*Attorney, Agent, or Firm*—Eugen E. Pacher

[57] ABSTRACT

Pulses of electromagnetic energy of appropriate peak power can form soliton pulses in monomode fiber. The width of such pulses changes during propagation, and can decrease for certain ranges of peak power, e.g., between about $P_o$ and $9/4\ P_o$, where $P_o$ is the "balanced" peak power. Using this property, repeaterless transmission of soliton pulses is possible if the pulses are non-electronically amplified by appropriate amounts at appropriate intervals. Exemplary amplifying means are glass laser, Raman laser, semiconductor laser medium, and cw injection.

10 Claims, 6 Drawing Figures

SOLITON FIBER TELECOMMUNICATION SYSTEMS

This application is a continuation of application Ser. No. 352,330, filed Feb. 25, 1982.

FIELD OF THE INVENTION

This application pertains to methods for transmitting electromagnetic pulse signals by means of monomode fiber telecommunication systems, and to such systems.

BACKGROUND OF THE INVENTION

Impressive progress has recently been made in the field of optical telecommunications. Systems are now being installed that permit transmission of data at a rate of many megabits/sec over distances of several kilometers between repeaters. However, since the economics of systems, such as, for instance, intercontinental submarine cable systems, are strongly affected by data rate and repeater spacing, work directed towards improvement in such system parameters continues.

High data rate fiber telecommunication systems typically are, and will likely continue to be, digital systems, and this application is concerned only with digital systems. Furthermore, this application is concerned only with digital fiber telecommunication systems using monomode fiber.

Although currently available fiber can transmit signals with relatively low loss and low dispersion, and although further improvement in these parameters can reasonably be anticipated, fiber telecommunication links require, and likely will continue to require, regeneration of the signal at so-called "repeaters" at points intermediate between the sending or input end and the receiving or output end of the fiber communication channel. "Input end" and "output end" refer, of course, to a single transmission, and can be reversed for a subsequent transmission.

Repeaters typically carry out two functions, namely, raising the power level of the signal pulse, and reshaping the pulse. In addition, repeaters frequently also retime the pulse. Raising of the power level is required due to the attenuation suffered by the signal in any real fiber. Reshaping is required because, due to dispersive effects of the fiber, pulses typically spread. And retiming is found to be often necessary to maintain proper pulse spacing.

Repeaters in fiber telecommunication systems typically comprise means for detecting the signal, e.g., a photodiode, means for operating on the output of the photo detector, e.g., amplifying and reshaping the electrical output signal of the detector, and a source for optical radiation, modulated typically by the amplified and reshaped output signal of the detector, as well as means for again coupling the output of the optical source into the fiber. Repeaters of the type described are not only being used now but are being considered also for future fiber telecommunication systems. See, for instance, P. E. Radley, and A. W. Horsley, *Proceedings of the International Conference on Submarine Telecommunication Systems*, London, February 1980, pp. 173-176.

Conventional repeaters are typically complex devices containing a significant number of components. For instance, a typical optical regenerator contains around 50 transistors (ibid., page 174). This "electronic" complexity, particularly in high bit-rate systems, as well as reliability problems encountered with laser sources, is making repeater costs a major cost item for the fiber telecommunication systems that are currently under consideration.

The conventional response to these facts has, inter alia, been an effort to improve fiber quality, with the results that now repeater spacing of about 50 km appear feasible. Nevertheless, difficulties associated with the use of repeaters are sufficiently severe to make consideration of alternative solutions important, and this application pertains to such an alternative solution. We will next discuss some fiber characteristics relevant to the invention.

Pulses of electromagnetic energy transmitted through optical fiber experience attenuation and dispersion, with the latter resulting in a broadening of the pulse in the time domain. If such broadening is sufficiently severe, adjacent pulses can overlap, resulting in loss of signal detectability. In monomode fiber, (i.e., fiber in which only the fundamental mode of the signal can propagate at the operating wavelength of the system) the two principal dispersion mechanisms are material dispersion and waveguide dispersion. A material of index of refraction n exhibits material dispersion at the wavelength $\lambda$ if $d^2n/d\lambda^2 \neq 0$ at that wavelength. Physically, this implies that the phase velocity of a plane wave travelling in such a medium varies nonlinearly with wavelength, and consequently a light pulse will broaden as it travels through such medium. Waveguide dispersion typically also is wavelength dependent. We will refer herein to the combined material and waveguide dispersion as "chromatic" dispersion. As an example, typical of magnitudes of chromatic dispersion effects in a typical monomode fiber, a 10 ps pulse of carrier wavelength 1.5 $\mu$m doubles its width after about 650 meters.

If in a medium $d^2n/d\lambda^2 > 0$ throughout a certain wavelength regime, then the medium is said to be normally dispersive in that regime. On the other hand, a wavelength regime throughout which $d^2n/d\lambda^2 < 0$ constitutes a so-called anomalous dispersion regime. In silica, for instance, a regime of normal dispersion extends from short wavelengths to about 1.27 $\mu$m, and an anomalous dispersion regime from about 1.27 $\mu$m to longer wavelengths. Separating the two regimes is a wavelength at which $d^2n/d\lambda^2 = 0$ i.e., at which material dispersion is zero to first order. This wavelength depends on the composition of the medium. The wavelength at which chromatic dispersion vanishes to first order similarly is composition dependent and, in addition, depends on such fiber parameters as diameter and doping profile. It can, for instance, be as high as about 1.5 $\mu$m in appropriately designed monomode silica-based fibers.

A natural choice of carrier wavelength in a high data rate fiber telecommunication system is the wavelength of first-order zero chromatic dispersion in the fiber. However, even at this wavelength, pulse spreading occurs due to higher order terms in the dispersion. See, for instance, F. P. Kapron, *Electronics Letters*, Vol. 13, pp. 96-97, (1977).

Recently, it has been proposed to use the nonlinear change of dielectric constant (Kerr effect) of a monomode fiber to compensate for the effect of chromatic dispersion, i.e., to utilize "solitons." For purposes of this application, we mean by "soliton" a pulse of electromagnetic radiation that propagates in monomode optical fiber with a characteristic constant shape.

A soliton pulse occurs when the broadening effect due to chromatic dispersion is balanced by a contraction due to the nonlinear dependence of the index of refraction on electric field. The existence of solitons in monomode fiber and the possibility of their stationary transmission was predicted by A. Hasegawa and F. Tappert, *Applied Physics Letters*, Vol. 23(3), pp. 142–144, (1973). That paper dealt with lossless monomode fibers, and taught the existence of a minimum pulse peak power, dependent, inter alia, on fiber parameters, pulse width and carrier wavelength, above which solitons can exist. These predictions of Hasegawa and Tappert have been verified, for instance, by demonstrating dispersionless transmission of a 7 ps pulse with a peak power of about 1 Watt at 1.45 $\mu$m through monomode fiber for a distance of about 700 meters. See, L. F. Mollenauer et al, *Physical Review Letters*, Vol. 45(13), pp. 1095–1098, (1980). Mollenauer et al also verified the prediction by Hasegawa and Tappert that soliton pulses of peak power in excess of the so-called "balanced" peak power $P_o$ undergo pulse narrowing.

Recently, A. Hasegawa and Y. Kodama have proposed the use of soliton pulses in high data rate monomode fiber telecommunication systems. See *Preceedings of the IEEE*, Vol. 69(9), September 1981, pp. 1145–1150. That paper contained an extensive discussion of the properties of solitons in ideal optical fiber, of the effects of higher order dispersion and of loss on solitons, as well as design examples and criteria, and is incorporated herein by reference.

Utilization of the Kerr effect to achieve pulse self-confinement in multimode fibers has also been proposed recently. U.S. patent application, Ser. No. 230,322, now U.S. Pat. No. 4,368,543 filed Feb. 2, 1980 by A. Hasegawa, entitled "Multimode Fiber Lightwave Communication System Utilizing Self-Confinement." Both the proposed monomode and the proposed multimode telecommunication systems utilize the self-confinement effect to achieve high rates of data transmission. They do, however, not address the question of pulse regeneration, and the difficulties inherent in conventional approaches of regeneration that were alluded to above.

SUMMARY OF THE INVENTION

We are disclosing a method and a system for transmitting a pulse of electromagnetic radiation, of carrier wavelength $\lambda_o$, through a fiber communication channel. The channel comprises single mode optical fiber, with $\lambda_o$ being a wavelength in the anomalous dispersion regime of the fiber. The method comprises coupling the pulse into the input end of the fiber, such that a soliton pulse, preferably a single soliton, is formed and propagates. The method further comprises amplifying the soliton pulse by non-electronic amplifying means located intermediate the input end and the output end of the channel, preferably without re-shaping the pulse, except as the pulse shape changes due to the soliton nature of the pulse. The disclosed system for transmitting the pulse comprises means for coupling the pulse into the fiber, and means for non-electronically amplifying the pulse, the latter means being located intermediate the input end and the output end of the channel.

It is comtemplated that the invention can be practiced by employing any appropriate non-electronic amplifying means. Exemplary means are a glass amplifier, i.e., a glass medium, typically a fiber, doped with an appropriate ion species (that is, ions having energy levels separated by an energy substantially equal to $hc/\lambda_o$, where h is Planck's constant and c is the speed of light in vacuum), ad pumped with electromagnetic radiation adapted to producing a population inversion in the energy levels. Another exemplary amplifying means is a Raman amplifier, e.g., a glass medium, typically a fiber, in which $\lambda_o$ is within a "Stokes" wavelength band of a pump radiation (see, for instance, *Optical Fiber Telescommunications*, S. E. Miller and A. G. Chynoweth, editors, Academic Press, (1979), pp. 127–132). Still another exemplary amplifying means is injection of a continuous wave (cw) of wavelength essentially equal to $\lambda_o$, in phase with the soliton, and of amplitude substantially lower than the pulse amplitude, whereby, through nonlinear interaction between pulse and cw, a pulse amplitude increase can result. And still another exemplary amplifying means is a semiconductor laser operated as an amplifying medium.

The above exemplary means are examples of "non-electronic" amplifying means, i.e., means in which the signal is at all times present in the form of a photon pulse, and is never present as an electron pulse. Amplifying means useful in the practice of the invention are non-electronic amplifying means, since they permit preservation of the phase of the pulse.

It will be appreciated that a soliton pulse does not attain its final (i.e., asymptotic) shape and pulse height at the moment of "amplification," i.e., when energy is transferred to the pulse (see, Hasegawa and Kodama, op. cit.), but rather, the pulse typically undergoes a change of pulse width and amplitude while it propagates through the fiber after having undergone the "amplification," to attain its final shape and amplitude after propagation for a distance of the order of $L_{NL}$, to be defined below. We herein contemplate amplification in this extended sense.

It is advantageous to choose the initial pulse power and pulse width as well as the amplifier spacing and amplification factors such that the above-referred-to changes are a pulse narrowing and an amplitude increase.

DETAILED DESCRIPTION

Figure 1:
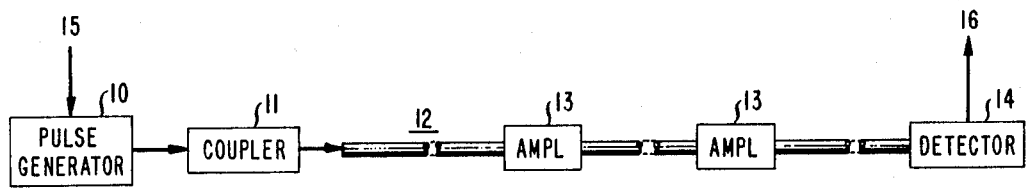
FIG. 1 schematically shows an exemplary telecommunication system for the practice of the invention.

It is an object of the instant invention to provide a method and a system for pulse transmission in which non-electronic pulse amplification is used. Such a system is made possible by the use of soliton pulses, in particular, through an appropriate use of the pulse narrowing property of solitons.

As was shown by Hasegawa and Kodama (op. cit., page 1147), the balanced peak electric field $\phi_o$ of a soliton pulse, i.e., the peak electric field in the signal which causes the pulse to retain its shape indefinitely in lossless ideal fiber, is $$\phi_o = \frac{\sqrt{2} \, (-\lambda^2 \partial^2 n/\partial \lambda^2)^{\frac{1}{2}}}{\omega_o t_o \sqrt{n_2}} \tag{1}$$

In this expression, $\lambda$ is the free space carrier wavelength, n is the index of refraction of the fiber, $\omega_o$ is the carrier angular frequency, $t_o$ is the half-pulse width, and $n_2$ is the nonlinear index of refraction of the fiber. Equation 1 can be used to define the balanced peak power $P_o$.

$$P_o = (\frac{1}{2}) v_g \phi_o^2 \epsilon_o S n^2 \tag{2}$$

In this expression, $v_g$ is the group velocity c/n, where c is the speed of light, $\epsilon_o$ is the dielectric constant of vacuum, S is the cross-sectional area of the fiber, and n is the index of refraction of the fiber.

As was shown by Hasegawa and Kodama, a one-soliton pulse can exist for peak power between one-fourth and nine-fourths $P_o$. A soliton having peak power between $P_o$ and nine-fourths $P_o$ will undergo pulse narrowing during transmission, and a soliton having peak power between one-fourth $P_o$ and $P_o$ will undergo pulse broadening. These authors also teach requirements to be observed in the production of a soliton pulse, as well as conditions to be observed in the design of a monomode fiber soliton transmission system, and these requirements and conditions will not be repeated here. Multiple soliton pulses have peak powers in excess of nine-fourths $P_o$. Although their use in the instant invention is possible, they are not preferred.

We will distinguish in this application between pulse regeneration and pulse amplification. By "regeneration" we mean a process in which at least the pulse amplitude is increased and the pulse width is decreased. Regeneration is typically carried out in an identifiable piece of apparatus, usually referred to as a repeater, and typically involves a change in the nature of the signal-carrying entity, from photons to e.g., electrons, and back to photons.

On the other hand, by "amplification" we mean a process by which, through injection of electromagnetic energy into the fiber, only the pulse amplitude is substantially changed, but no means are provided in the amplifying means for changing the pulse width or shape. The change in amplitude contemplated herein is an increase. At least part of the amplification process is typically carried out in an identifiable piece of apparatus, to be referred to herein as an amplifier. Amplification schemes useful in the practice of the invention are non-electronic, i.e., they do not involve a change in the nature of the signal-carrying entity. In other words, in such a scheme the pulse remains a photon pulse throughout the amplification process.

It is possible to practice the invention by providing, in addition to the amplifying means, additional non-electronic pulse shaping means, e.g., sections of fiber comprising material having a large Kerr coefficient. Such embodiments are considered to be within the scope of our invention.

Since fiber loss is the only factor which contributes to the deterioration a soliton pulse through pulse spreading, while at the same time neither the loss nor chromatic dispersion, including higher order dispersion, substantially changes the fundamental shape of the soliton pulse, it is possible to obtain a pulse-width preserving channel by providing means for non-electronic amplification of a soliton pulse, without need for extrinsic pulse shaping means. That is to say, in a system according to the invention, non-electronic amplification of the soliton pulse takes the place of the typically more complicated pulse regeneration hitherto required.

FIG. 1 schematically depicts a generalized fiber telecommunication system according to the invention. Pulses of electromagnetic radiation, emitted by pulse generating means 10, are coupled by coupling means 11 into monomode fiber 12. Pulse generation is controlled by means of input signal 15. Since any real fiber causes attenuation of pulses transmitted therethrough, pulses arriving at non-electronic amplifier 13 are lower in amplitude than they were when they were coupled into the input end of the fiber. After amplification in amplifier 13, pulses continue their transit through the fiber, being periodically re-amplified at further amplifiers 13, until the pulses reach the end of the transmission channel at its output end and are detected by detecting means 14. Reshaping of the pulse typically takes place inherently during transmission. Signal 16 is derived from the detecting means and contains essentially the information that has been carried by signal 15.

A requirement for the existence of soliton pulses is that the carrier wavelength is in the region of anomalous dispersion of the fiber. By "carrier wavelength" we mean the center wavelength of the pulse spectrum. For silica-based fiber, this condition implies that the carrier wavelength has to be above about 1.27 $\mu$m. Advantageous wavelengths for operation of a system according to the invention are near 1.5 $\mu$m, since silica-based fiber typically has a loss minimum in this wavelength region, with fiber loss being potentially as low as 0.2 db/km.

Any possible source of coherent electromagnetic radiation of the appropriate wavelength and intensity is contemplated to be within the scope of the invention. For instance, such a source could be an appropriate semiconductor laser, or a gas laser. Means for coupling the pulsed radiation into the fiber are also well known to those skilled in the art and will not be discussed herein. Similarly, means for detecting the signal pulses are well known to those in the art and do not require discussion.

All appropriate non-electronic means for amplifying the soliton pulses are contemplated, and the scope of the invention is considered independent of the nature of the amplification means employed. Exemplary means are doped glass amplifiers, Raman amplifiers semiconductor laser media, and continuous wave (cw) injection, a process that will be discussed in greater detail below.

Figure 2:
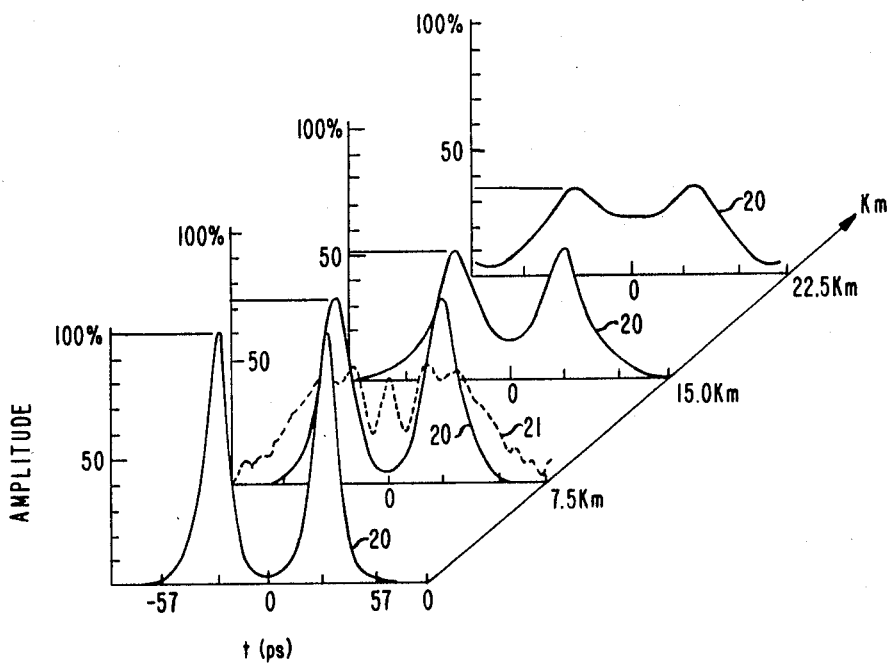
FIG. 2 shows computed pulse shapes for a pair of soliton pulses absent amplification, and for a pair of linear pulses.

FIG. 2 shows in time sequence the computed development of the pulse shape of two pulses, originally having pulse width of approximately 14 ps each, spaced about 57 ps apart, as they are propagating through silica-based monomode fiber, the fiber having core cross-sectional area of 20 $\mu$m$^2$. The pulses have a carrier wavelength of 1.5 $\mu$m, and the fiber is assumed to have 0.2 db/km loss at that wavelength. The pulses are assumed to have an input amplitude of 1.26·10$^6$ volt/meter, and the balanced peak power $P_o$ for the assumed conditions is 105 mW. The curves 20 are the computed pulse shapes for solitons, i.e., the appropriate nonlinear index of refraction was used in the calculation ($n_2 = 1.2 \cdot 10^{-22}$(m/V)$^2$). As can be seen from FIG. 2, in the absence of amplification the soliton pulses broaden sufficiently that after 22.5 km the pulses have substantially merged. Curve 21 is the computed pulse shape for two linear pulses of the same initial amplitude and width as the pulses of curve 20. By "linear" we mean that the nonlinear coefficient of the index of refraction was assumed to be zero. As can be seen, after about 7.5 km the linear pulses have undergone drastic change.

Figure 3:
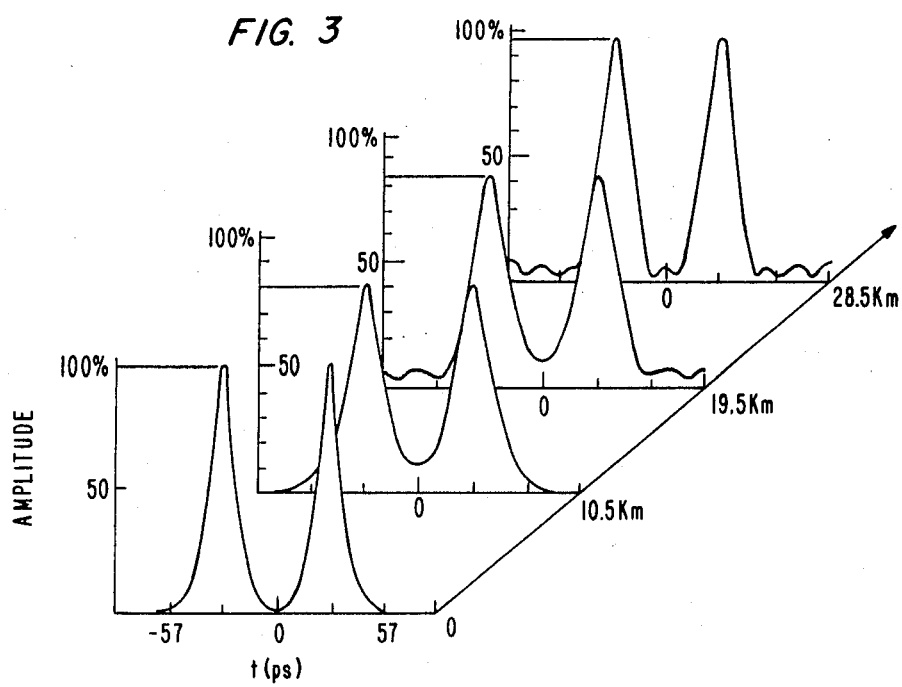
FIG. 3 shows computed pulse shape for a pair of periodically amplified soliton pulses.

FIG. 3 shows the computed pulse shape for two periodically amplified solitons. Fiber properties were assumed to be the same as were assumed in FIG. 2, and similarly, the same initial pulse shape and amplitude was used. Amplification by 1.9 db was assumed to take place after 9.4 km, 18.8 km and 28.2 km. As can be seen, underthese conditions, the soliton pulses substantially retain their shape and other attributes.

Figure 4:
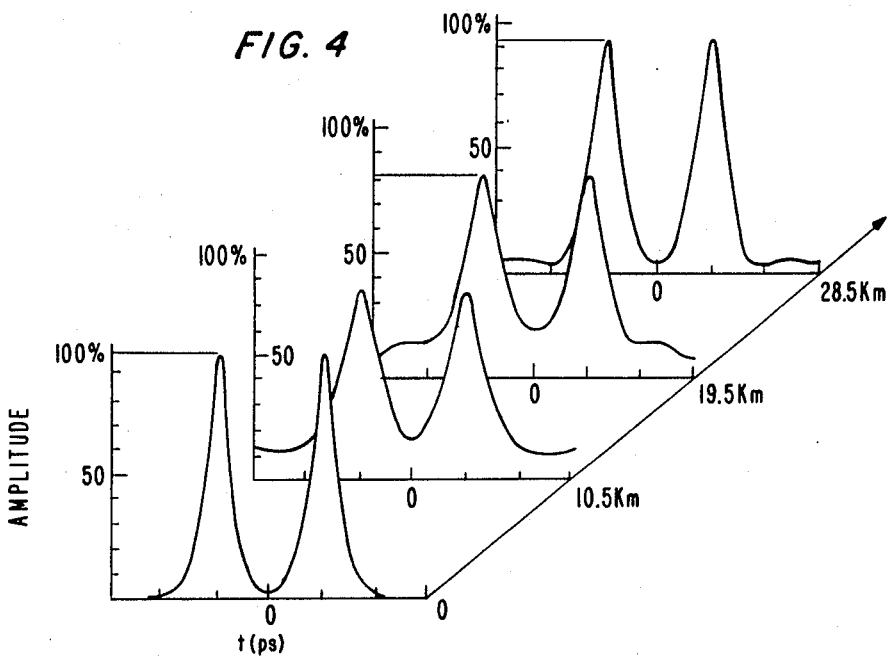
FIG. 4 shows computed pulse shapes for a pair of soliton pulses with periodic cw injection, and for the same pair absent the cw injection.

FIG. 4 shows the computed pulse shapes for two solitons, initially identical to those assumed in FIGS. 2 and 3, propagating through fiber having the same properties as assumed previously, for the case of periodic cw injection. The cw is assumed to have identical wavelength as the carrier wavelength of the pulses, to be in phase with the soliton, and to have an amplitude 11% of the initial soliton peak amplitude. Injection is assumed to occur at 9.4 km, 18.8 km, and 28.2 km. As can be seen from FIG. 4, under the assumed conditions, the soliton pulses also substantially retain their shape and other attributes.

Figure 5:
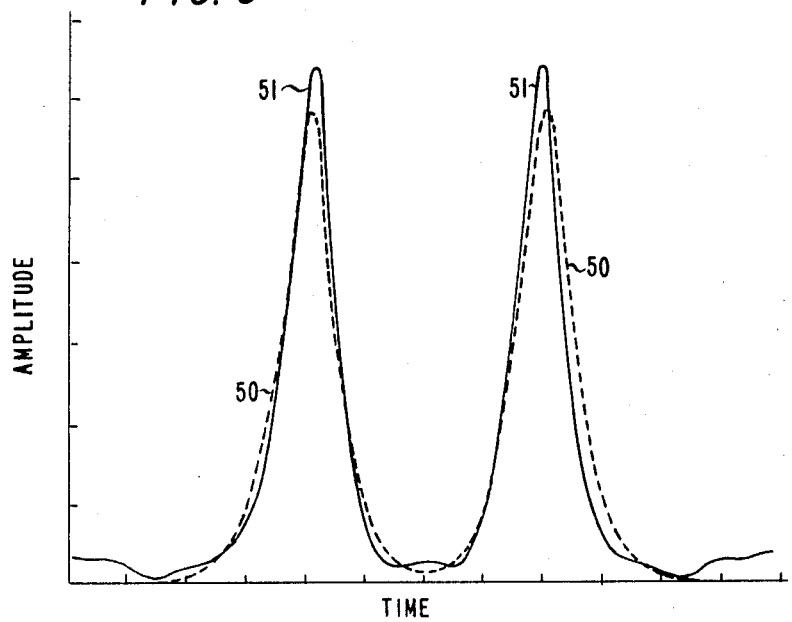
FIGS. 5 and 6 show computed pulse shapes for a pair of periodically amplified soliton pulses after propagation through about 1000 km and about 6000 km of fiber, respectively.
Figure 6:
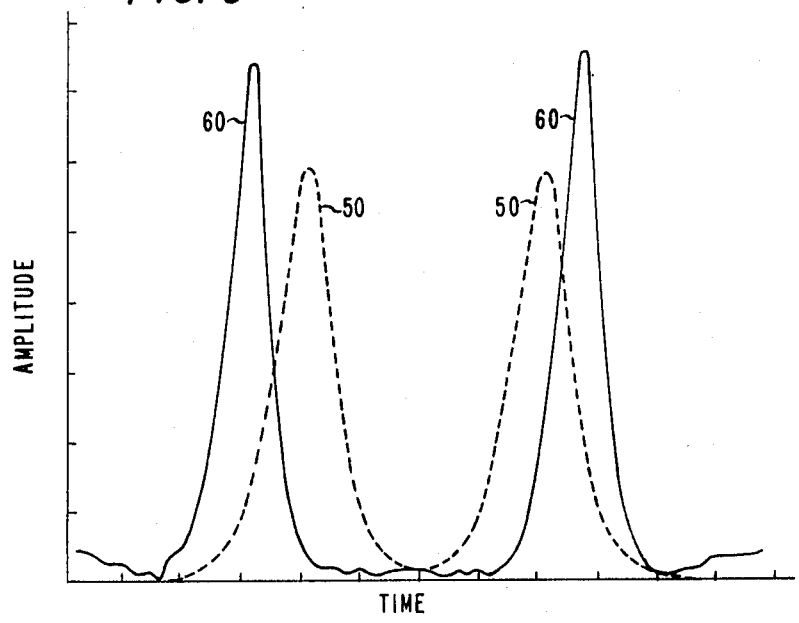

FIGS. 5 and 6 show a computed pair of soliton pulses after 1080 km and 5940 km, respectively, with amplification by about 1.3 db every 6.75 km. The assumed fiber properties are those used in FIG. 2, the input peak power is 11.2 mW, the full pulse width at half maximum is about 42 ps, the pulse spacing is about 170 ps, and the carrier wavelength 1.5 $\mu$m. Curve 50 in FIGS. 5 and 6 represents the input pulse, curve 51 of FIG. 5 the solitons after transmission through more than 1000 km of fiber, and curve 60 of FIG. 6 the same soliton pair after transmission through about 6000 km of fiber. As can be seen, pulse shapes are remarkably well preserved under the assumed conditions. The change of pulse spacing observable in FIG. 6 is due to the interaction between the two solitons.

As was stated by Hasegawa and Kodama (op. cit., page 1147), a pulse having an initial peak power other than the balanced peak power will, during propagation, undergo a change in pulse width and amplitude. For instance, an assumed input pulse whose envelope is given by $$\phi(\tau 0), = aq_0 \text{sech}(g_0\tau),$$

with $\frac{1}{2} \leq a \leq 3/2$, will yield asymptotically a one-soliton pulse (in the absence of attenuation) of envelope shape given by $$a_\infty q_0 \text{sech}(a_\infty q_0 \tau).$$

$a_\infty = (1+2\alpha)$, and $a = 1+\alpha$, with $|\alpha| < \frac{1}{2}$. Thus, for $a = 3/2$, the maximum possible amplitude for a one-soliton pulse, $a_\infty = 2$, the peak power of the asymptotic soliton is about 4 times the peak power of the input pulse, and the asymptotic width is reduced to about one-half of the width of the initial pulse. Similarly, if a soliton pulse is amplified by a factor a, (a>1), then, absent fiber loss, the resulting asymptotic soliton increases in amplitude by about (2a−1) times the original soliton pulse, and decreases in width by about $(2a-1)^{-1}$ times the original pulse width.

It is to be noted that, before the pulse shape settle down to its asymptotic one soliton, its shape oscillates and the pulse loses some energy. For silica-based fiber, the oscillation period $L_{NL}$ in meters is approximately given by (ibid, eqn. 2.25')

$$L_{NL}(m) = \frac{5.3\lambda(\mu m)S(\mu m^2)}{P(W)}$$

where P(W) is the peak power of the pulse in watt, $\lambda(\mu m)$ is the carrier wavelength in $\mu$m, and S is the core cross section of the fiber core in $(\mu m)^2$.

An exemplary means for amplifying the soliton pulse is injection into the fiber of cw of essentially the same wavelength and substantially the same phase as the soliton carrier. Such injection can result in a soliton pulse of narrower width and larger amplitude. The portions of the cw which are not utilized for the amplification of the pulse can be eliminated through further injection of cw at appropriately located later amplification points, resulting in destructive interference of the cw. Analysis shows that the soliton amplitude increases by about $\pi$ times the cw amplitude, and the width decreases by the same amount, if wavelength and phase equality between carrier and cw exists. Thus, if cw of amplitude $E_o$ is injected into a fiber whenever the soliton amplitude has decreased, due to attenuation, by about $\pi E_o$, then the original soliton structure can be recovered.

Unwanted accumulation of unused cw can be avoided if injection points are spaced such as to result in destructive interference of successively injected cw, while at the same time resulting always in constructive interference with the soliton carrier. That is possible since the phase of the soliton shifts continuously during propagation, whereas cw maintains a constant phase. Hasegawa and Kodama (op. cit.) have given expressions for determining the soliton phase as a function of propagation distance, and appropriate cw injection points can be determined by the use of these or equivalent expressions. If the initial phase of the soliton is $\tau_o$ then cw injection is advantageously arranged after a propagation distance T such that the phase $$\tau(T) = 2\pi/m + \tau_o,$$

where m is a positive integer.

As an example of the amplification by repeated injection of cw, using the parameters recited in the description of FIG. 2 above, it is possible to maintain a soliton pulse substantially unchanged through injection of cw of amplitude $1.8 \cdot 10^5$V/m and every 9.4 km, if the original soliton has a width of about 14 ps, yielding a balanced peak power of about 105 mW.

What is claimed is:
1. Optical fiber telecommunication system comprising
   (a) a source of pulses of electromagnetic radiation of carrier wavelength $\lambda_o$;
   (b) a fiber transmission channel having an input location and an output location spaced apart from the input location, the channel comprising optical fiber that is single mode fiber for radiation of wavelength $\lambda_o$ and has anomalous dispersion in a wavelength region containing $\lambda_o$; and
   (c) means for coupling at least one pulse into the channel at the input location and means for detecting the pulse at the output location, the pulse being transmitted through the channel from the input to the output location; the pulse having a peak power and a pulse width, the single mode fiber having loss at the wavelength $\lambda_o$, the loss resulting in a decrease of the peak power of the pulse with increasing distance from the input location, the system further comprising (d) nonelectronic means, located intermediate the input location and the output location, for increasing the peak power of the pulse and for simultaneously decreasing the pulse width of the pulse, whereby the merging of the pulse with an adjacent pulse can be substantially prevented, "nonelectronic means" being means in which a pulse is present at all times in form of a pulse of electromagnetic radiation, and is never present in form of an electron pulse.

2. System of claim 1, wherein the peak amplitude and pulse width of the pulse are selected to make the pulse a soliton pulse in at least a part of the channel, and the nonelectronic means are acting on the pulse at least in the part of the channel in which the pulse is a soliton pulse.

3. System of claim 2, wherein the nonelectronic means comprise means for injecting substantially continuous wave (cw) electromagnetic radiation into the single mode optical fiber, the radiation to be referred to as pump radiation.

4. System of claim 3, wherein the pump radiation is radiation of wavelength differing from $\lambda_o$.

5. System according to claim 4, wherein the amplifying means comprise a Raman amplifier.

6. System according to claim 3, wherein the amplifying means comprise means for injecting continuous wave electromagnetic radiation of wavelength essentially equal to $\lambda_o$ into the fiber, the injected radiation being substantially in phase with the carrier wave of the pulse.

7. System according to claim 2, wherein the soliton pulse is a single soliton.

8. System according to claim 2, wherein the amplifying means comprise fiber doped with ions having energy levels separated by an energy substantially equal to $hc/\lambda_o$, where h is Planck's constant, and c is the speed of light in vacuum.

9. System of claim 8 wherein the amplifying means comprise means for pumping the doped fiber with electromagnetic radiation adapted to producing a population inversion in the energy levels.

10. System according to claim 2, wherein the amplifying means comprise a semiconductor laser medium.

* * * * *